(12) United States Patent
Hara

(10) Patent No.: US 8,395,444 B2
(45) Date of Patent: Mar. 12, 2013

(54) ELECTRONIC CIRCUIT

(75) Inventor: Hiroshi Hara, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/167,197

(22) Filed: Jun. 23, 2011

(65) Prior Publication Data

US 2011/0316622 A1 Dec. 29, 2011

(30) Foreign Application Priority Data

Jun. 24, 2010 (JP) ................. 2010-144263

(51) Int. Cl.
*H03G 3/20* (2006.01)

(52) U.S. Cl. ........................ 330/141; 330/308

(58) Field of Classification Search .......... 330/141, 330/281, 308
See application file for complete search history.

(56) References Cited

U.S. PATENT DOCUMENTS 7,671,680 B2 * 3/2010 Hara ........................ 330/141
8,054,136 B2 * 11/2011 Hara ........................ 330/308

FOREIGN PATENT DOCUMENTS

JP 2010-057014 A 3/2010

* cited by examiner

*Primary Examiner* — Khanh V Nguyen
(74) *Attorney, Agent, or Firm* — Westerman, Hattori, Daniels & Adrian, LLP

(57) ABSTRACT

An electronic circuit includes an amplifier that amplifies an input signal, a control circuit configured to generate a control signal by averaging an output signal of the amplifier based on a time constant, a first time constant control circuit configured to generate a first time constant control signal based on the control signal, the first time constant control signal changing the time constant of the control circuit to a second time constant from a first time constant smaller than the second time constant, a second time constant control circuit configured to generate a second time constant control signal by averaging the output signal of the amplifier based on a third time constant between the first time constant and the second time constant, the second time constant control signal changing the time constant of the control circuit to the first time constant from the second time constant, and a bypass circuit bypassing the input signal of the amplifier based on the control signal.

13 Claims, 7 Drawing Sheets

ELECTRONIC CIRCUIT

CROSS-REFERENCE TO RELATED APPLICATION

This application is based upon and claims the benefit of priority of the prior Japanese Patent Application No. 2010-144263, filed on Jun. 24, 2010, the entire contents of which are incorporated herein by reference.

BACKGROUND (i) Technical Field

A certain aspect of the embodiments discussed herein is related to an electronic circuit.

(ii) Related Art

Recently, FTTH (Fiber To The Home) of a PON (Passive Optical Network) system has been utilized. The FTTH system is required to receive a light signal sent from each home having a respective amplitude and amplify the light signal in the form of electric signal. There is known an AGC (Automatic Gain Control) circuit that controls the gain of an amplifier on the basis of the output of the amplifier. Japanese Patent Application Publication No. 2010-57014 discloses an electronic circuit that uses a hold circuit to suppress variations of a reference signal applied to the amplifier.

However, the gain control may not be carried out reliably.

SUMMARY

According to an aspect of the present invention, there is provided an electronic circuit capable of controlling the gain of an amplifier reliably.

According to another aspect of the present invention, there is provided an electronic circuit including: an amplifier that amplifies an input signal; a control circuit configured to generate a control signal by averaging an output signal of the amplifier based on a time constant; a first time constant control circuit configured to generate a first time constant control signal based on the control signal, the first time constant control signal changing the time constant of the control circuit to a second time constant from a first time constant smaller than the second time constant; a second time constant control circuit configured to generate a second time constant control signal by averaging the output signal of the amplifier based on a third time constant between the first time constant and the second time constant, the second time constant control signal changing the time constant of the control circuit to the first time constant from the second time constant; and a bypass circuit bypassing the input signal of the amplifier based on the control signal.

DETAILED DESCRIPTION

Figure 1A:
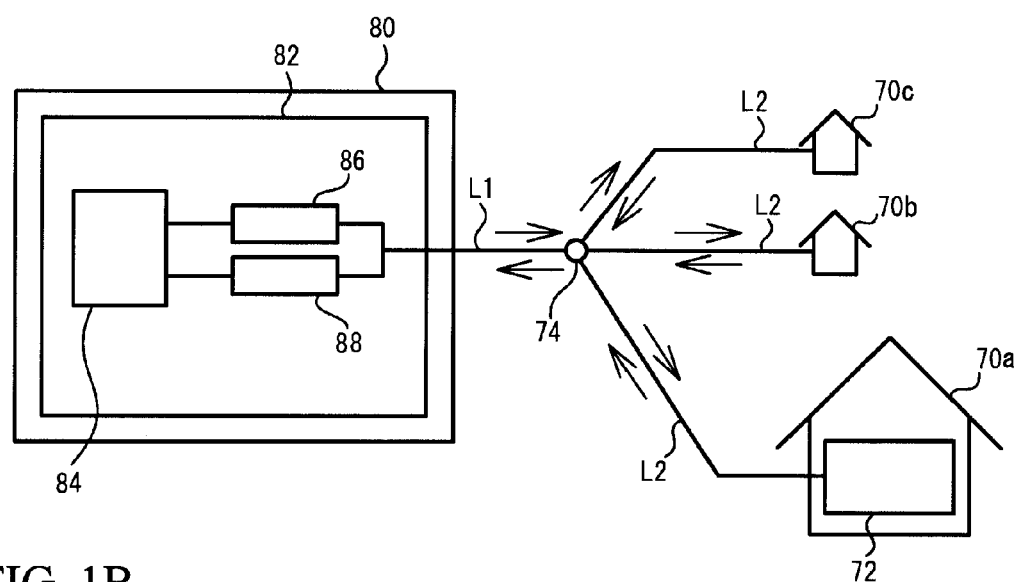
FIG. 1A is a block diagram of a PON communication system.

Now, a description is given of a PON communication system, which may be an exemplary system to which the present invention may be applied. FIG. 1A is a block diagram of an example of the PON communication system. An office-side communication unit 82 installed in an office 80 is connected to home-side communication units 72 respectively provided in homes 70a through 70c via communication lines L1 and L2, which may be optical fibers. The office-side communication unit 82 and an optical splitter 74 are connected by a single communication line L1. The optical splitter 74 and the home-side communication units 72 are connected via the respective communication lines L2. The optical splitter 74 combines signals output from the home-side communication units 72 via the communication lines L2 to the communication line L1. The signals on the communication line L1 are input to and output from the office-side communication unit 82. The office-side communication unit 82 has a control circuit 84, a transmission part 86 and a reception part 88. The transmission part 86 is a transmitter that sends light signals to the home-side communication units 72. The reception part 88 is a receiver that receives light signals from the home-side communication units 72. The control circuit 84 is a circuit that controls the transmission part 86 and the reception part 88.

Figure 1B:
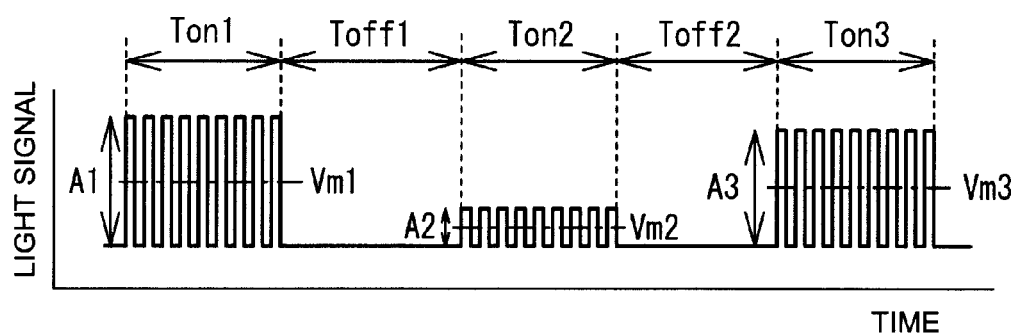
FIG. 1B is a schematic diagram of a light signal of the PON system with time.

FIG. 1B is a schematic diagram of a light signal applied to a light receiving element (see photodiode 2 in FIG. 2) of the reception part 88 with time. During a period Ton1, a light signal from the home-side communication unit 72 of the home 70a is input to the light receiving element. During a period Toff1, no light signal is input to the light receiving element. During a subsequent period Ton2, a light signal from the home-side communication unit (not illustrated) of the home 70b is input to the light receiving element. During a period Toff2, no light signal is input to the light receiving element, and during a subsequent period Ton3, a light signal from the home-side communication unit (not illustrated) of the home 70c is input thereto. The output signals of the home-side communication units 72 may have different amplitudes and may receive different losses on the respective communication lines L2. In FIG. 1B, the light signals during the periods (input signal periods) Ton1, Ton2 and Ton3 have respective different amplitudes A1, A2 and A3. As described above, the light signals of the different amplitudes are irregularly input to the reception part 88 for PON from the different homes. The periods Toff1 and Toff2 are used to switch the communication lines L2 and are interval periods. The amplifier circuit used in the reception part 88 may include an automatic gain control because the light signals applied thereto have different amplitudes.

Figure 2:
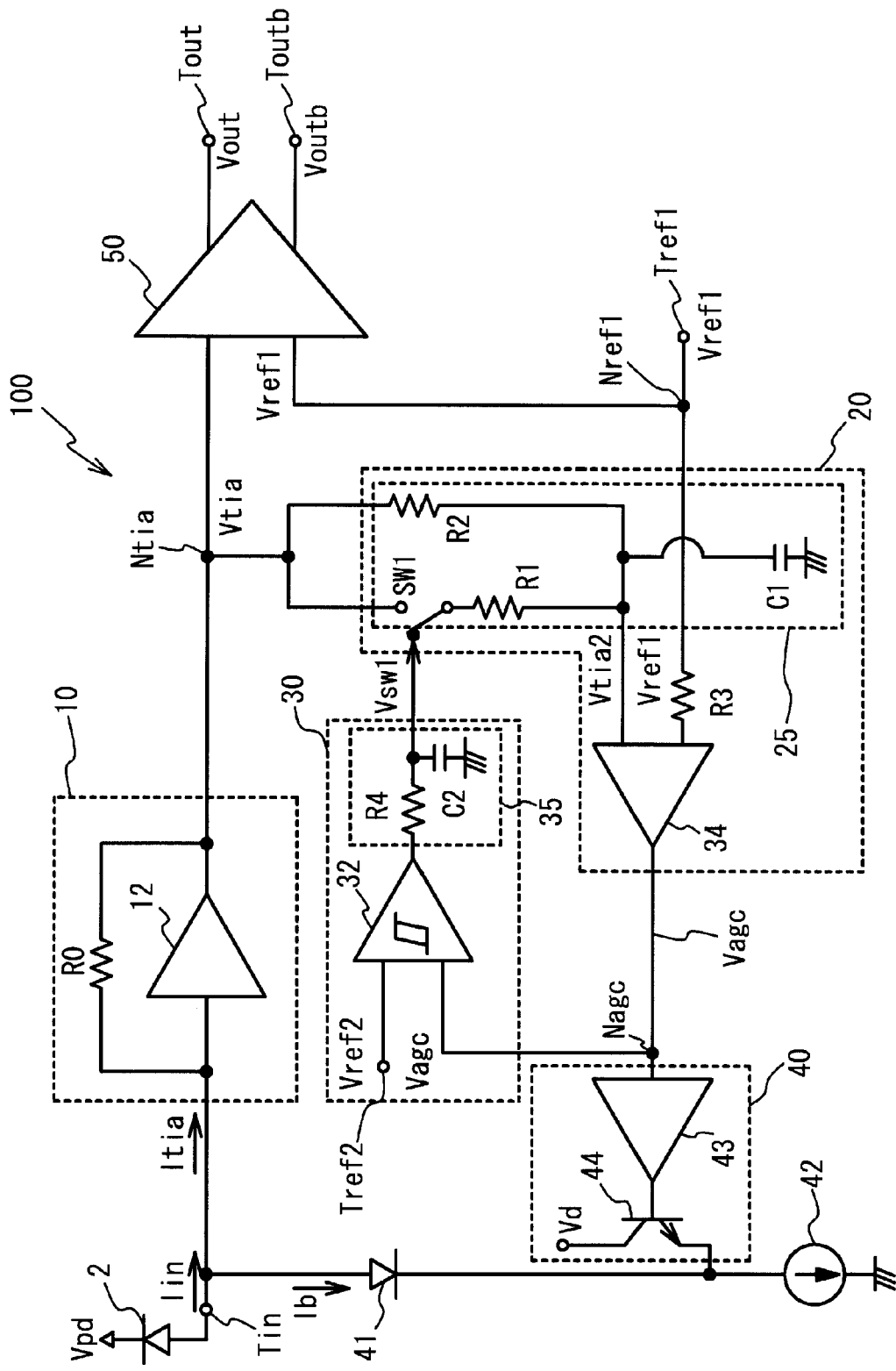
FIG. 2 is a circuit diagram of an amplifier circuit in accordance with a comparative example.

Next, a comparative example is described. FIG. 2 is a circuit diagram of an amplifier circuit 100 in accordance with a comparative example.

As illustrated in FIG. 2, the amplifier circuit 100 is equipped with an amplifier 10, a control circuit 20, a first time constant control circuit 30, a bypass circuit 40 and a differential amplifier 50. In the comparative example, the time constant of the control circuit 20 is described as τ1. The anode of a photodiode 2 is connected to an input terminal Tin. The cathode of the photodiode 2 is connected to a power supply Vpd. An input signal (input current) Iin, which is a communication signal input to the input terminal Tin, is an input signal (input current) Itia of the amplifier 10.

The amplifier 10 has an amplifier 12 and a feedback resistor R0, and functions as a transimpedance amplifier that converts current to voltage. The amplifier 10 amplifies the input signal and outputs an output signal (output voltage) Vtia to a node Ntia. The differential amplifier 50 amplifiers the difference between the output signal Vtia and a reference signal (reference voltage) Vref1 applied to a reference terminal Tref1. That is, when the output signal Vtia is larger than the reference signal Vref1, the differential amplifier 50 applies a positive output signal (output voltage) Vout to an output terminal Tout and applies a negative output signal Voutb to an output terminal Toutb. When the output signal Vtia is smaller than the reference signal Vref1, the differential amplifier 50 applies the negative output signal Vout to the output terminal Tout, and applies the positive output signal Voutb to the output terminal Toutb. The output signals Vout and Voutb are complementary signals. The differential amplifier 50 is used as a limiter amplifier, and is capable of generating the output signals Vout and Voutb having rectangular waveforms.

The control circuit 20 has resistors R1, R2 and R3, a switch SW1, a capacitor C1 and a differential amplifier 34. The resistors R1 and R2, the switch SW1 and the capacitor C1 form a hold circuit 25. That is, the control circuit 20 includes the hold circuit 25. The hold circuit 25 is connected to the output of the amplifier 10. The resistors R1 and R2 are connected between the node Ntia and the bypass circuit 40. The switch SW1 is connected between the node Ntia and the resistor R1. The resistor R2 has a resistance larger than that of the resistor R1. The resistors R1 and R2 are provided with the output signal Vtia of the amplifier 10. The capacitor C1 is connected between the ends of the resistors R1 and R2 at the bypass circuit 40 side and ground, and stores the charge based on the output of the resistor R1 or the outputs of both the resistors R1 and R2. When the switch SW1 is ON, the resistors R1 and R2 are connected in parallel and are connected in series to the capacitor C1. When the switch SW1 is OFF, only the resistor R2 is connected to the capacitor C1 in series.

The hold circuit 25 averages the output signal Vtia by using the time constant defined by the resistors R1 and R2 and the capacitor C1, and outputs a resultant output signal (output voltage) Vtia2, which is input to one of the two terminals of the differential amplifier 34. The other input terminal of the differential amplifier 34 is connected to the reference terminal Tref1 via the resistor R3. The differential amplifier 34 amplifiers the difference between the output signal Vtia2 of the hold circuit 25 and the reference signal Vref1, and outputs a control signal (control voltage) Vagc to a node Nagc. That is, the control circuit 20 averages the output signal Vtia and generates the control signal Vagc. The node Nagc to which the differential amplifier 34 is connected is connected to the base of a transistor 44 via a buffer circuit 43 of the bypass circuit 40, and is connected to a hysteresis comparator 32 of the first time constant control circuit 30.

The first time constant control circuit 30 has the hysteresis comparator 32, a resistor R4 and a capacitor C2. The resistor R4 and the capacitor C2 form a delay circuit 35. That is, the first time constant control circuit 30 includes the delay circuit 35. The hysteresis comparator 32 compares the control signal Vagc with a reference signal (reference voltage) Vref2 applied to a reference terminal Tref2. The amount of delay of the hysteresis comparator 32 is less than that of the delay circuit 35. When the control signal Vagc is smaller than the reference signal Vref2, the output signal (output voltage) Vsw1 of the hysteresis comparator 32 delayed by the delay circuit 35 becomes low. When the control signal Vagc becomes larger than the reference signal Vref2, the output signal Vsw1 becomes high. For example, the signal Vsw1 that is high is defined as a first time constant control signal. That is, the first time constant control circuit 30 generates the first time constant control signal by using the control signal Vagc. The first time constant control circuit 30 generates the first time constant control signal (which may be realized by setting the signal Vsw1 high) on the basis of the result of comparison between the control signal Vagc and the reference signal Vref2.

The first time constant control signal (which is Vsw1 at the high level) is input and the switch SW1 is turned ON. When the switch SW1 is ON, the resistance of the hold circuit 25 is reduced and the time constant is also reduced. In contrast, when Vsw1 at the low level is input, the switch SW1 is turned OFF. When the switch SW1 is OFF, the resistance of the hold circuit 25 is increased and the time constant is also increased. That is, the time constant T1 for averaging of the control circuit 20 may be switched between $\tau s1$ (first time constant) and $\tau l1$ (second time constant) longer than $\tau s1$ in accordance with a change of the resistance of the hold circuit 25. The first time constant control circuit 30 switches the time constant $\tau 1$ of the control circuit 20.

A diode 41 and a current source 42 are connected between the input terminal Tin and ground. The anode of the diode 41 is connected to the input terminal Tin, and the cathode thereof is connected to the current source 42. The bypass circuit 40 includes a buffer circuit 43 and the transistor 44. The collector of the transistor 44 is connected to a power supply Vd, and the emitter thereof is connected between the diode 41 and the current source 42. The base of the transistor 44 is provided with the control signal Vagc via the buffer circuit 43. When the voltage of the control signal Vagc decreases, the bypass circuit 40 decreases the potential of the node between the diode 41 and the current source 42, and causes a part of the input signal to flow to the ground as a bypass current Ib. The bypass circuit 40 causes part of the input signal to bypass the amplifier 10 on the basis of the control signal Vagc. Since part of the input signal is not applied to the amplifier 10, which receives the reduced input signal Itia. Thus, the gain of the amplifier circuit 100 is decreased. That is, the bypass circuit 40 performs a control to increase the bypass current Ib when the output signal Vtia increases so that the signal Itia input to the amplifier 10 can be reduced.

Figure 3:
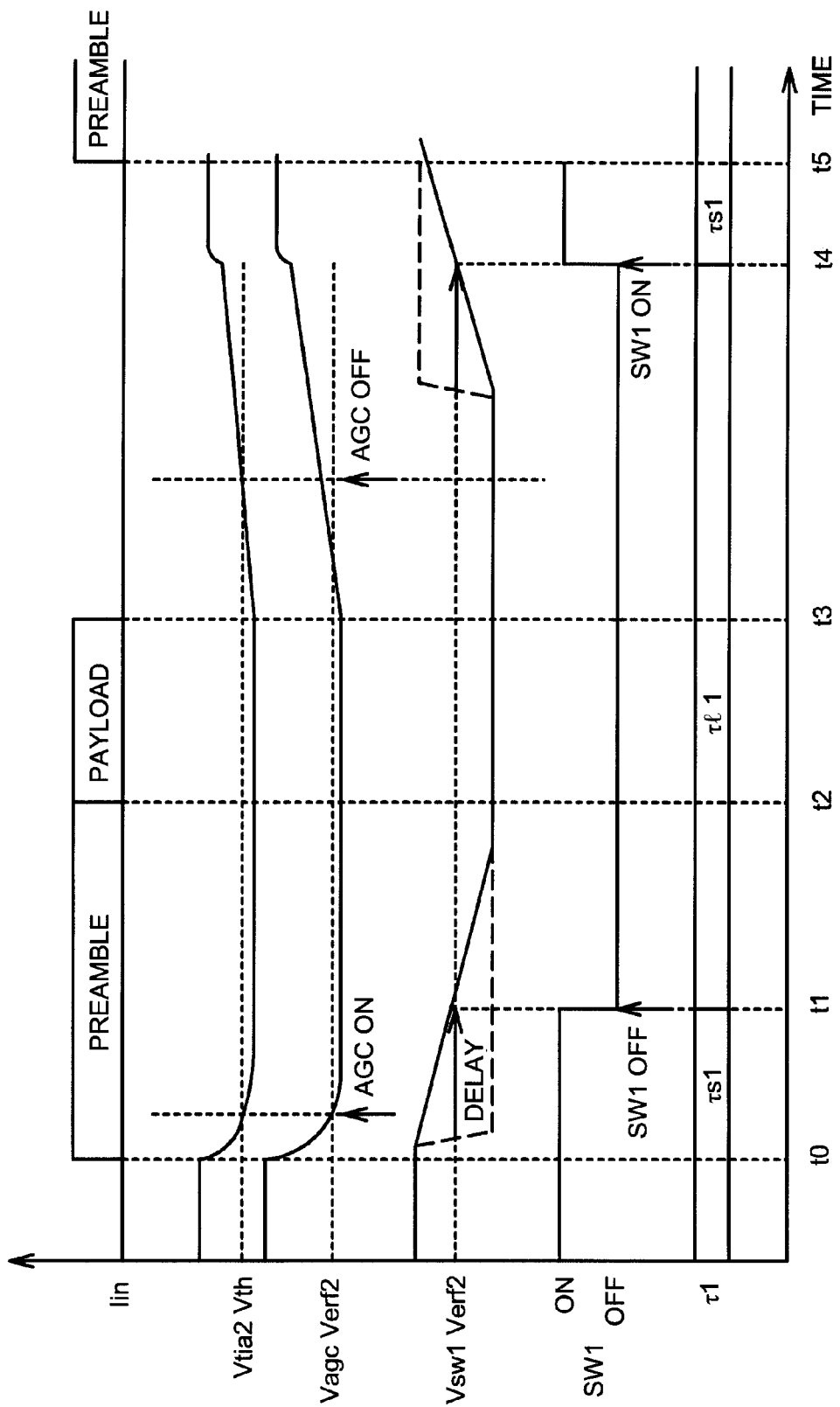
FIG. 3 is a timing chart of an operation of the amplifier circuit of the comparative example.

FIG. 3 is a timing chart of an operation of the amplifier circuit 100 of the comparative example. In FIG. 3, from the top thereof, there are serially illustrated the input signal Iin, the control signal Vagc, the signal Vsw1, the operation of the switch SW1 and the time constant $\tau 1$ with time. A broken line related to the signal Vsw1 indicates a virtual case where the delay circuit 35 is not used. The solid line related to the switch SW1 indicates ON when it is illustrated in the upper portion, and indicates OFF when it is illustrated in the lower portion.

Referring to FIG. 3, the input signal Iin has a preamble signal and a payload signal. The preamble signal is a signal that stabilizes the control signal Vagc (or averages the output signal Vtia). The payload signal is a signal for data transmission and reception. The following times are defined. A time $t_0$, the preamble signal starts. At time $t_2$, the preamble signal ends and the payload signal starts. At time $t_3$, the payload signal ends. At time $t_5$, the next preamble signal starts. At time $t_1$, the time constant $\tau 1$ of the control circuit 20 is changed to $\tau l1$ from $\tau s1$. At time $t_4$, the time constant $\tau 1$ is changed to $\tau s1$ from $\tau l1$.

At time $t_0$, the control signal Vagc is the output signal Vtia of the initial state before the input signal Iin comes. The signal Vsw1 is output from the first time constant control circuit 30. The time constant $\tau 1$ for averaging at that time is $\tau s1$ that is a relatively short time constant. Soon after the preamble signal starts, the output signal Vtia2 of the hold circuit 25 approaches to the average of the output signal Vtia with the time constant τs1. When the output signal Vtia2 becomes smaller than the reference signal Vref1 (threshold value Vth), the bypass circuit 40 starts to allow the bypass current Ib to flow to the ground to initiate the automatic gain control (AGC ON).

The control signal Vagc changes like the output signal Vtia2 and approaches to the average of the output signal Vtia. Since the first time constant control circuit 30 includes the delay circuit 35, the signal Vsw1 lags behind the control signal Vagc. When the control signal Vagc becomes smaller than the reference signal Vref2 (threshold value), the signal Vsw1 changes to the low level at the time $t_1$ after the delay by the delay circuit 35. That is, only the switch SW1 is turned OFF, and the time constant τ1 of the control circuit 20 is changed to τl1 from τs1.

The payload signal ends at time $t_3$, and the output signal Vtia2 and the control signal Vagc start to increase and return to the original states with the time constant τl1. When the output signal Vtia2 becomes larger than the reference signal Vref1 (threshold voltage Vth), the bypass circuit 40 cuts off the bypass current Ib and finishes the automatic gain control (AGC OFF). The signal Vsw1 becomes larger than the reference signal Vref2. The signal Vsw1 changes to the high level at time $t_4$ after the delay by the delay circuit 35. That is, the switch SW1 is turned ON, and the time constant τ1 of the control circuit 20 is changed to τs1 from τl1. At time $t_5$, the next signal comes.

Figure 4:
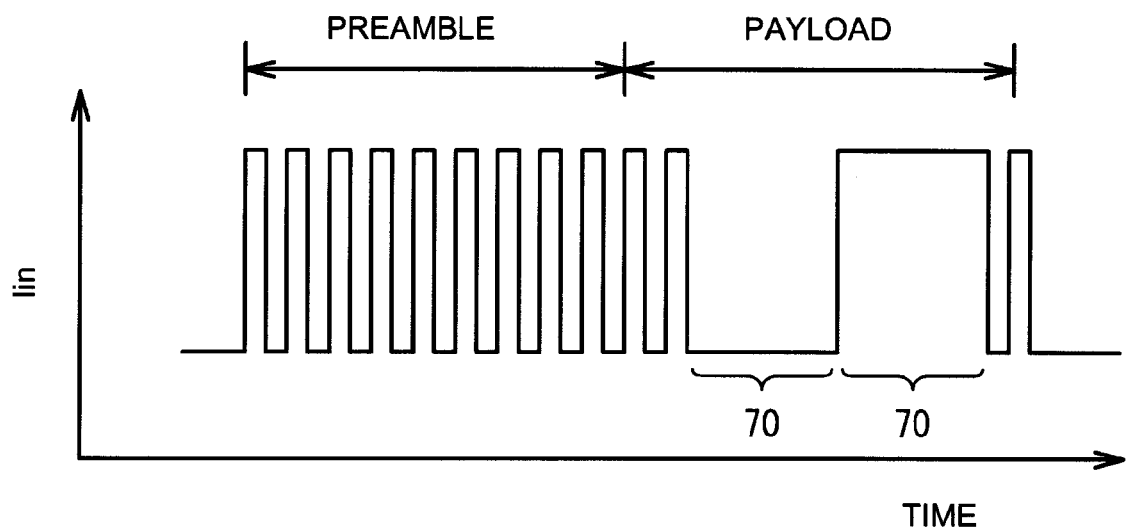
FIG. 4 is a diagram of an exemplary input signal.

FIG. 4 is a diagram that illustrates an example of the input signal Iin. The horizontal axis is time and the vertical axis is the amplitude of the input signal Iin. As illustrated in FIG. 4, the input signal Iin has a data train configured to include a preamble period and a payload period following the preamble period. The preamble signal is used to stabilize the control signal Vagc, and alternately changes to the high level and the low level with constant periods. As illustrated in FIG. 1B, the input signals from the homes have different amplitudes. As illustrated in FIG. 4, the control signal Vagc is stabilized during the period when the preamble signal is available. The payload signal changes to the high level and the low level irregularly. For example, identical bits may successively appear. In this case, as illustrated in FIG. 4, a long high-level period or a long low-level period as indicated by reference numerals 70 continues.

In a case where the long high-level or low-level period of the payload signal continues, a variation of the control signal Vagc may change the gain of the amplifier circuit 100, which is caused to be unstable. In order to avoid the above, the resistance of the control circuit 20 may be set larger and the time constant τ1 for averaging may be set longer. However, the longer time constant lengthens the time it takes to stabilize the control signal Vagc and the automatic gain control may be started after time $t_2$ at which the preamble signal ends.

As illustrated in FIG. 3, in the comparative example, the switch SW1 is kept ON during the preamble signal period, so that the resistance of the control circuit 20 is reduced and the time constant τ1 is set to τl1 that is comparatively short. Thus, the time constant may be controlled in response to the input signal.

The signal Vsw1 is delayed by the delay circuit 35. That is, the signal Vsw1 indicated by the solid line in FIG. 3 is delayed as compared to that indicated by the broken line. Thus, the time when the switch SW1 is turned OFF is delayed. As a result of this delay, the time constant of the control circuit 20 is changed to the long time constant Tl1 after the control circuit 20 sufficiently operates with the short time constant τs1. Time $t_1$ at which the time constant τ1 is changed to τl1 from τs1 is later than the time at which the automatic gain control is initiated. In other words, the time constant of the control circuit 20 is τs1 at the time when the automatic gain control is initiated, and the control signal Vagc is thus stabilized early.

In order to receive the next signal after the signal is received, it is required to change the time constant τ1 of the control circuit 20 to the short time constant τs1 from the long time constant τl1. This change should be done as quickly as possible. However, it is required to have the long time constant τl1 in order to receive the payload signal. Thus, the amplifier circuit 100 may have a degraded response to the next signal.

As illustrated in FIG. 2, the amplifier circuit 100 is equipped with the delay circuit 35. Thus, as seen from the signals Vsw1 and SW1 in FIG. 3, the time when the time constant of the control circuit 20 is changed from the long time constant τl1 to the short time constant τs1 is later than the time obtained when the delay circuit 35 is not provided. That is, the initialization of the delay circuit 35 is delayed and the response of the amplifier circuit 100 to the next signal deteriorates. That is, the change from τs1 to τl1 is delayed to stabilize the automatic gain control, whereas the change from τl1 to τs1 is delayed and the initialization of the control circuit 20 is delayed. Thus, in case where the time $t_5$ at which the next signal is input comes earlier, it may be difficult to receive the signal.

It has been studied to use a reset signal to change of the time constant of the control circuit 20 from τl1 to τs1. However, this uses an additional circuit for outputting the reset signal, and the circuit configuration may be complicated. In addition, it is required to synchronize the reset signal with the end time of the signal. An embodiment described below is capable of solving the above problem.

Figure 5:
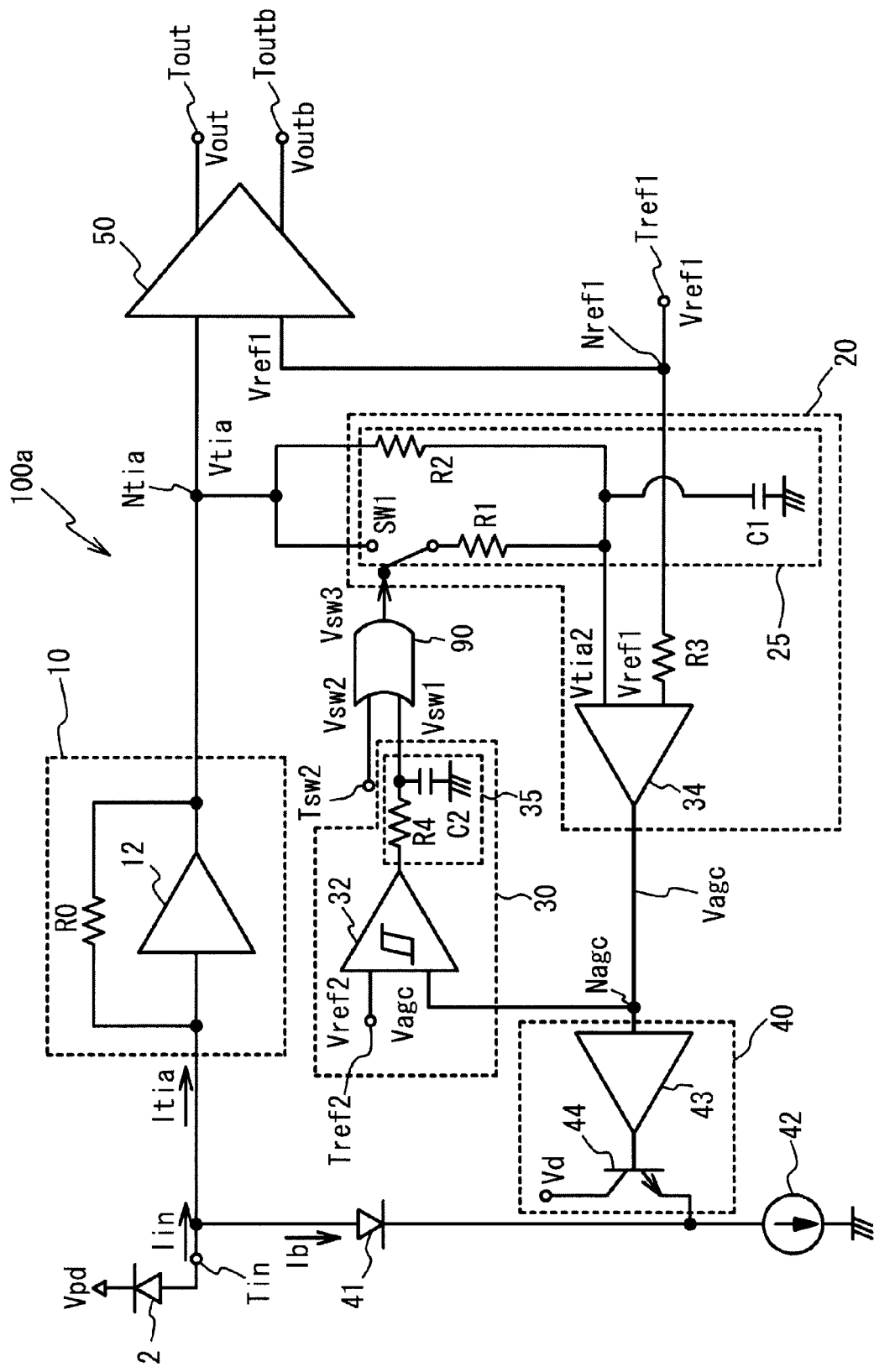
FIG. 5 is a circuit diagram of a part of an amplifier circuit in accordance with a first embodiment.
Figure 6:
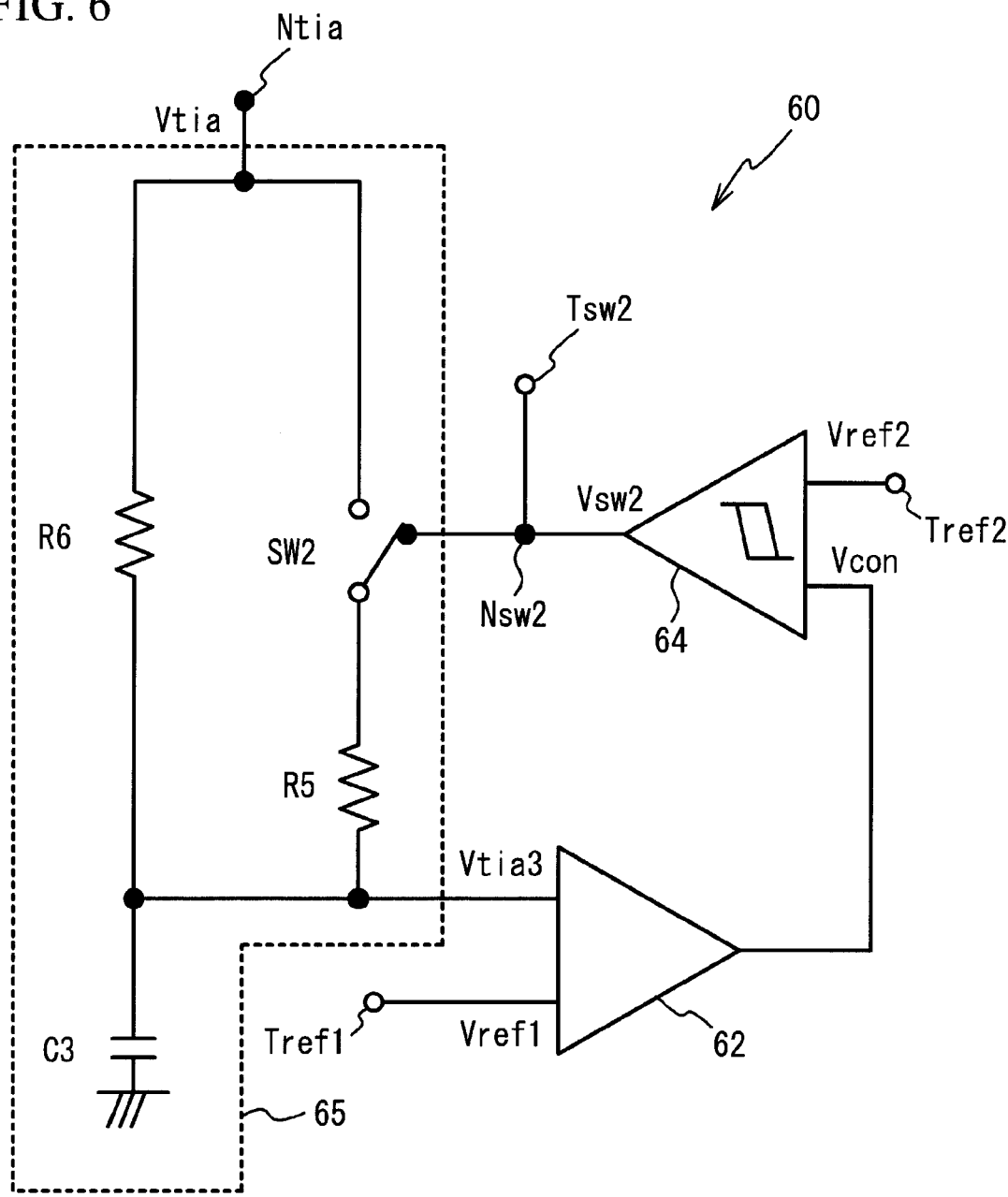
FIG. 6 is a circuit diagram of another part of the amplifier circuit in accordance with the first embodiment.

FIGS. 5 and 6 are circuit diagrams of an amplifier circuit 100a in accordance with a first embodiment.

As illustrated in FIGS. 5 and 6, the amplifier circuit 100a of the first embodiment is configured to add an OR circuit 90 and a second time constant control circuit 60 to the amplifier circuit 100 illustrated in FIG. 2. In the first embodiment, the time constant of a second time constant control circuit 60 is described as τ2, and the time constant of the control circuit 20 is described as τ3. As illustrated in FIG. 5, the OR circuit 90 is provided between the output of the delay circuit 35 and the switch SW1. The OR circuit 90 is provided with the signal Vsw1 from the first time constant control circuit 30 and a signal Vsw2 via a terminal Tsw2 to which the second time constant control circuit 60 is connected. An output signal (output voltage) Vsw3 of the OR circuit 90 is at the high level when at least one of the signals Vsw1 and Vsw2 is at the high level, and is at the low level when both the signals Vsw1 and Vsw2 are at the low level. The switch SW1 is not switched when the signal Vsw3 is at the low level, and is switched when the signal Vsw3 is at the high level. That is, the high-level signal from the OR circuit 90 is a signal used to change the time constant τ3 of the control circuit 20 from τl1 to τs1.

As illustrated in FIG. 6, the second time constant control circuit 60 is equipped with resistors R5 and R6, a capacitor C3, a switch SW2, a differential amplifier 62 and a hysteresis comparator 64. The resistors R5 and R6 and the capacitor C3 form a hold circuit 65. That is, the second time constant control circuit 60 includes the hold circuit 65. The resistors R5 and R6 are connected between the node Ntia and the capacitor C3. The resistors R5 and R6 are connected in parallel, and the switch SW2 is connected between the node Ntia and the resistor R5. A node Nsw2 is provided between the hysteresis comparator 64 and the switch SW2, and the reference terminal Tsw2 is connected to the node Nsw2. The resistor R5 has a resistance smaller than that of the resistor R6. The resistors R5 and R6 are provided with the output signal Vtia of the amplifier 10 illustrated in FIG. 5. The capacitor C3 is connected between the ends of the resistors R5 and R6 closer to the differential amplifier 62 and ground, and stores the outputs of the resistors R5 and R6. When the switch SW2 is ON, the resistors R5 and R6 are connected in parallel and are connected to the capacitor C3 in series. When the switch SW2 is OFF, only the resistor R6 is connected to the capacitor C3 in series.

The hold circuit 65 averages the output signal Vtia with the time constant defined by the resistors R5 and R6 and the capacitor C3, and generates an output signal (output voltage) Vtia3. The differential amplifier 62 amplifies the difference between the output signal Vtia3 of the hold circuit 65 and the reference signal Vref1 applied to the reference terminal Tref1, and outputs a resultant control signal Vcon. That is, the second time constant control circuit 60 averages the output signal Vtia, and generates the control signal Vcon. The hysteresis comparator 64 compares the control signal Vcon with the reference signal Vref2 (threshold value) applied to the reference terminal Tref2, and outputs the output signal (output voltage) Vsw2. This output signal (output voltage) Vsw2 is applied to the switch SW2, and is applied to the reference terminal Tsw2 via the node Nsw2. When the control signal Vcon becomes smaller than the reference signal Vref2, the output signal Vsw2 becomes low. When the control signal Vcon becomes larger than the reference signal Vref2, the control signal Vsw2 becomes high. For example, the high-level control signal Vsw2 is used as the second time constant control signal. That is, the second time constant control circuit 60 generates the second time constant control signal on the basis of the result of the comparison between the control signal Vcon and the reference signal Vref2. For example, the second time constant control circuit changes the control signal Vsw2 to the high level.

The high-level second time constant control signal Vsw2 causes the switch SW2 to make a connection between the node Ntia and the resistor R5 (SW2 ON). In this case, the resistance of the hold circuit 65 is reduced and the time constant is also reduced. In contrast, the low-level second time constant control signal Vsw2 causes the switch SW2 to disconnect the resistor R5 from the node Ntia (SW2 OFF). In this case, the resistance of the hold circuit 65 is increased and the time constant is also increased. That is, the time constant τ2 of the second time constant control circuit 60 for averaging is switchable between the time constant τl2 (third time constant) and the time constant τs2 (fourth time constant) shorter or smaller than τl2 in response to the change of the resistance of the hold circuit 65 The control signal Vsw2 is applied to the OR circuit 90 illustrated in FIG. 5. The control signal Vsw2 applied to the reference terminal Tsw2 is input to the OR circuit 90 via the reference terminal Tsw2 illustrated in FIG. 5.

A description is now given of the capacitance, resistance and time constant in the control circuit 20 and the second time constant control circuit 60. The capacitor C3 of the second time constant control circuit 60 may have the same resistance as that of the capacitor C1 of the control circuit 20. The resistor R5 may have a resistance that is equal to that of the resistor R1 and is smaller than that of the resistor R2. The resistance of the resistor R5 may be smaller than that of the resistor R1. The resistor R6 may have a resistance that is equal to the resistances of the resistors R1 and R5 and is smaller than that of the resistor R2. Thus, the time constant τs1 of the control circuit 20 obtained when the switch SW1 is ON is equal to the time constant τs2 of the second time constant control circuit 60 obtained when the switch SW2 is ON. The time constant τs2 is smaller than τs1. The time constant τl1 of the control circuit 20 obtained when the switch SW1 is OFF is larger than the time constant τl2 of the second time constant control circuit 60 obtained when the switch SW2 is OFF. The time constant τl2 is larger than the time constant τs1. The above relationships are collectively described by expressions (1) and (2) shown below:

$$R5 \leq R1 < R6 < R2 \tag{1}$$

$$\tau s2 \leq \tau s1 < \tau l2 < \tau l1 \tag{2}.$$

The relationship between the resistors is not limited to the expression (1). The capacitor C2 may have a capacitance equal to or different from that of the capacitor C1. That is, it is enough to obtain the time constants that satisfy the expression (2) by adjusting the resistors and capacitors C1 and C2. Now, the operation of the amplifier circuit 100a is described.

Figure 7:
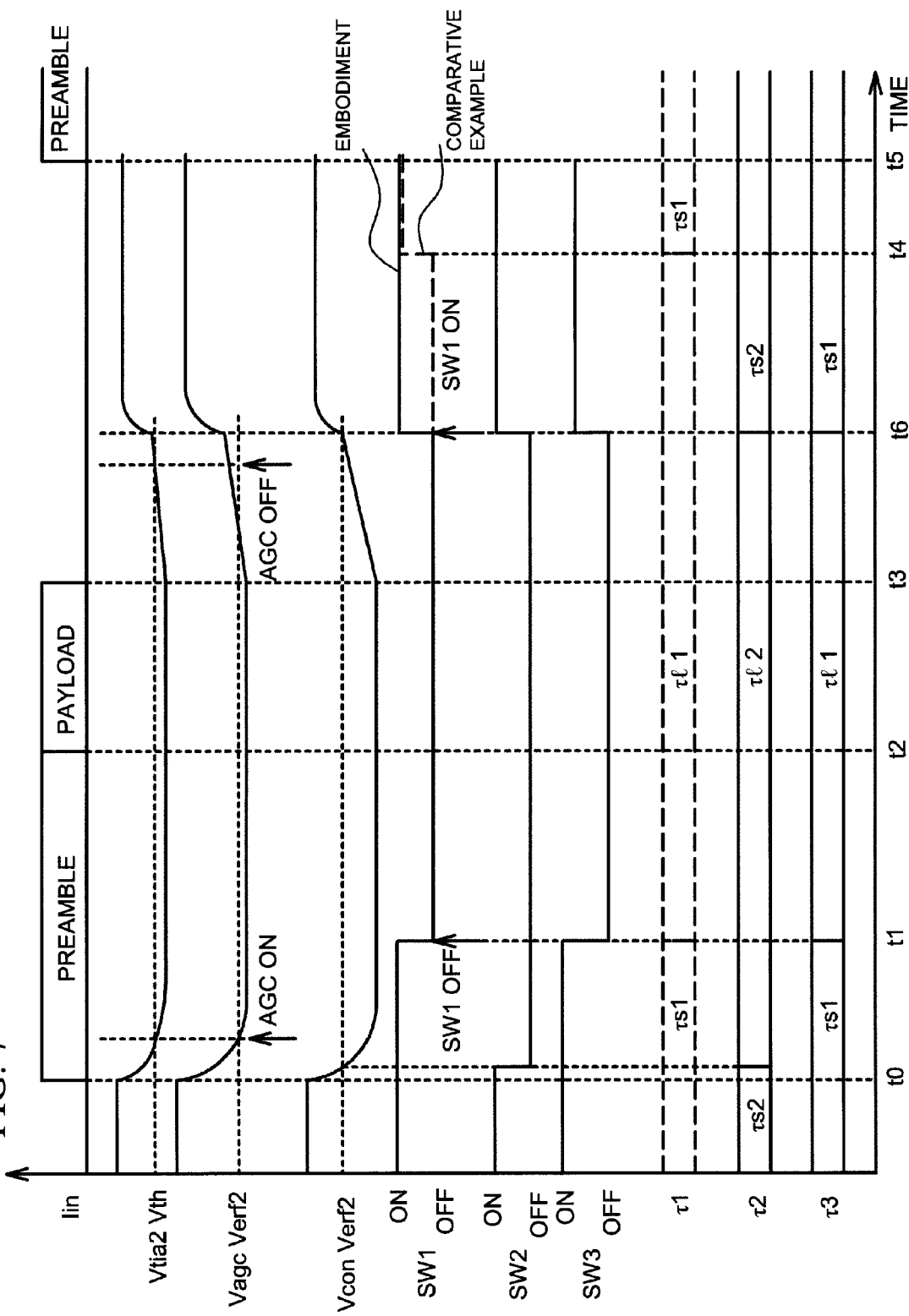
FIG. 7 is a timing chart of an operation of the amplifier circuit in accordance with the first embodiment.

FIG. 7 is a timing chart of an operation of the amplifier circuit 100a in accordance with the first embodiment. In FIG. 7, from the top thereof, there are serially illustrated the input signal Iin, the output signal Vtia2, the control signals Vagc and Vcon, the switches SW1 and SW2, the output signal Vsw3 of the OR circuit 90, the time constant T1 (broken line) of the control circuit 20 of the comparative example, the time constant τ2 of the second time constant control circuit 60, and the time constant τ3 of the control circuit 20 of the first embodiment with time. In FIG. 7, the switch SW1 of the comparative example is depicted by a broken line, and that of the first embodiment is depicted by a solid line. The signal Vsw3 is high when the solid line is illustrated in the upper portion, and is low in the lower portion. The signal Vsw1 operates like the case illustrated in FIG. 3. In FIG. 7, the resistors R1 and R5 have an identical resistance, and the time constants τs1 and τs2 are equal to each other.

As illustrated in FIG. 7, at time $t_0$, the time constant τ3 of the control circuit 20 of the first embodiment is τs1 and the time constant τ2 of the second time constant control circuit 60 is τs2. The control signal Vcon behaves like the control signal Vagc and approaches to the average of the output signal Vtia with the time constant τs2 equal to the time constant τs1. At time $t_0$, the signals Vsw1 and Vsw2 are high. That is, the first time constant control circuit 30 generates a first time constant control signal (which may be produced by changing the signal Vsw1 to the high level), and the second time constant control circuit 60 generates a second time constant control signal (which may be produced by changing the signal Vsw2 to the high level). The first and second time constant control signals are input to the OR circuit 90. Thus, the output signal Vsw3 of the OR circuit 90 is high. When the control signal Vcon becomes smaller than the reference signal Vref2 (threshold value) after time $t_0$, the signal Vsw2 becomes low, and the switch SW2 is turned OFF. At this time, the first time constant control signal is being output (the high-level Vsw1 in FIG. 3). Thus, the output signal Vsw3 of the OR circuit 90 is maintained at the high level, and the switch SW1 is kept ON.

As in the case of FIG. 3, the signal Vsw1 becomes low at time $t_1$. That is, at time $t_1$, the first time constant control circuit 30 does not generate the first time constant control signal (which may be realized by changing the signal Vsw1 to the low level), and the second time constant control circuit 60 does not generate the second time constant control signal (which may be realized by changing the signal Vsw1 to the low level). That is, the first and second time constant control signals are not input to the OR circuit 90 at all. At this time, the output signal Vsw3 of the OR circuit 90 is low. Thus, the switch SW1 is changed to OFF, and the time constant τ3 of the control circuit 20 is changed to τl1 from τs1. At time $t_3$, the payload signal ends, and the output signal Vtia2 and the control signals Vagc and Vcon start to increase. At that time, the time constant τl2 of the second time constant control circuit 60 is smaller than the time constant τl1 of the control circuit 20, and the control signal Vcon increases earlier than the control signal Vagc.

At time $t_6$, the control signal Vcon becomes larger than the reference signal Vref2, and the signal Vsw2 becomes high. In response to the high-level signal Vsw2 (second time constant control signal), the switch SW2 is turned ON from OFF, and the time constant τ2 of the second time constant control circuit 60 is changed to τs2 from τl2. Even before the first time constant control signal is applied, the output signal Vsw3 of the switch SW1 is turned ON from OFF in response to the applied high-level signal Vsw2 (second time constant control signal). In response to the change of the signal Vsw3 to the high level, the switch SW1 is turned ON from OFF, and the time constant τ3 of the control circuit 20 is changed to τs1 from τl1. As indicated by a broken line in FIG. 7, the switch SW1 is turned ON at time $t_4$ in the comparative example. Thus, the time constant τ1 of the control circuit 20 is changed to τs1 from τl1 at time $t_4$. In contrast, in the first embodiment, the time constant τ3 of the control circuit 20 is changed to τs1 from τl1 at time $t_6$ that is earlier than time $t_4$.

According to the first embodiment, the second time constant control circuit 60 generates the second time constant control signal and switches the time constant of the control circuit 20 from τl1 to τs1 with the time constant τl2 larger than τs1 and smaller than τl1. Thus, the switching from τl1 to τs1 can be done earlier than the switching in the case where the second time constant control circuit 20 is not provided like the comparative example. That is, the amplifier circuit 100a may be initialized earlier and the responsivity to the next signal may be improved. Thus, even if time $t_5$ in FIG. 7 becomes earlier, the amplifier circuit 100a is capable of receiving the signal. It is also possible to make the time constant τl1 of the control circuit 20 longer to perform the automatic gain control more stably. Consequently, the above enables the appropriate gain control. Further, the configuration may be simplified because there is no need to use the system that outputs the reset signal.

The first time constant control circuit 30 generates the first time constant control signal (which may be realized by changing the signal Vsw1 to the high level) when the control signal Vagc becomes smaller than the reference signal Vref2. The first time constant control signal is a signal used to change the time constant τ3 of the control circuit 20 to τl1 from τs1 (time $t_1$ in FIGS. 3 and 7). The second time constant control circuit 60 generates the second time constant control signal (which may be realized by changing the signal Vsw2 to the high level) when the control signal Vcon becomes smaller than the reference signal Vref2. The second time constant control signal is a signal used to change the time constant τ2 of the second time constant control circuit 60 to τs2 from τl2 (time $t_6$ in FIG. 7). The OR circuit 90 outputs the high-level signal when at least one of the first time constant control signal and the second time constant control signal is input. That is, the OR circuit 90 outputs the high-level signal at time $t_6$ when the first time constant control signal is not yet input to the OR circuit 90 but the second time constant control signal is input thereto. Thus, the time constant of the control circuit 20 is changed to τl1 from τs1. Thus, the amplifier circuit 100a is initialized at time $t_6$ prior to time $t_4$. Until time $t_1$ after the switch SW2 is switched OFF, the OR circuit 90 is not provided with the first time constant control signal but is provided with the second time constant control signal (the high-level signal Vsw2). Thus, the signal Vsw3 output by the OR circuit 90 is kept high and the control circuit 20 maintains the short time constant τs1. That is, the control signal Vagc is quickly stabilized during the preamble period, and the automatic gain control may be done stably.

The amplifier circuit 100a is equipped with the delay circuit 35. The first time constant control signal is delayed by the delay circuit 35 and is then input to the OR circuit 90. Thus, the switch SW1 of the first embodiment is turned OFF with a delay as in the case of FIG. 3. Thus, as illustrated in FIG. 7, the switching of the time constant of the control circuit 20 from τs1 to τl1 is delayed and the automatic gain control may be performed stably. In the first embodiment, the second time constant control signal output by the second time constant control circuit 60 is input to the OR circuit 90 without the delay. Thus, the switch SW3 is turned ON from OFF with the time constant τl2 of the second time constant control circuit 60. That is, the switching of the time constant of the control circuit 20 from τl1 to τs1 is not delayed is not delayed even when the delay circuit 35 is provided. It is thus possible to perform the automatic gain control stably and initialize the control circuit 20 quickly.

The first time constant control circuit 30 changes the time constant of the control circuit 20 to τl1 from τs1 in the preamble period. That is, the control circuit 20 quickly averages the output signal Vtia with the time constant τs1 in the preamble period and retains the long time constant τl1 during the payload period. It is thus possible to realize the early stabilization and the stable automatic gain control. The first time constant control circuit 30 changes the time constant to τl1 from τs1 after the bypass circuit 40 initiates the bypass operation. It is thus possible to perform the automatic gain control more stably.

The second time constant control circuit 60 changes the time constant of the control circuit 20 to τs1 from τl1 until the next preamble period comes after the payload period ends. It is thus possible to initialize the amplifier circuit 100a before the next signal is input. Thus, the responsivity of the amplifier circuit 100a to the next signal is improved. In addition, the long time constant stabilizes the automatic gain control. When the signal is being received, the second time constant control circuit 60 does not change the time constant of the control circuit 20. Thus, the amplifier circuit 100a receives the signal reliably.

The second time constant control circuit 60 can switch the time constant between the short time constant τs2 and the long time constant τl2. Thus, the time constant is changed to τs2 from τl2, and thereafter, the second time constant control circuit 60 is quickly initialized. The above description with reference to FIG. 7 assumes that the resistors R5 and R1 have an identical resistance. However, as has been described, the resistor R5 may have a resistance equal to or smaller than that of the resistor R1. When the resistance of the resistor R5 is equal to or smaller than that of the resistor R1, the time constant τs2 is equal to or smaller than τs1. That is, the second time constant control circuit 60 changes the time constant to τl2 from τs2 before the time constant of the control circuit 20 is changed to τl1 from τs1. Thus, the averaging with the time constant τl2 is started and ends earlier than the averaging with the time constant τl1. That is, the switch SW2 is turned ON earlier than the switch SW1 is turned ON in the case where the second time constant control circuit 60 is not provided as in the case of the comparative example. That is, the time constant of the control circuit 20 to τs1 is carried out earlier. Thus, the switch SW1 is turned ON earlier and the amplifier circuit 100a is initialized earlier.

The present invention is not limited to the specifically disclosed embodiments but may include other embodiments and variations without departing from the scope of the present invention.

What is claimed is:

1. An electronic circuit comprising: an amplifier that amplifies an input signal; a
    control circuit configured to generate a control
    signal by averaging an output signal of the amplifier based on a time constant;
    a first time constant control circuit configured to generate a first time constant control signal based on the control signal, the first time constant control signal changing the time constant of the control circuit to a second time constant from a first time constant smaller than the second time constant;
    a second time constant control circuit configured to generate a second time constant control signal by averaging the output signal of the amplifier based on a third time constant between the first time constant and the second time constant, the second time constant control signal changing the time constant of the control circuit to the first time constant from the second time constant; and
    a bypass circuit bypassing the input signal of the amplifier based on the control signal.

2. The electronic circuit according to claim 1, wherein: the second time constant control signal changing a time constant of the second time constant control circuit to a fourth time constant smaller than the third time constant from the third time constant.

3. The electronic circuit according to claim 1, further comprising a switch circuit configured to output a signal for changing the time constant of the control circuit to the first time constant from the second time constant in response to at least one of the first time constant control signal and the second time constant control signal, wherein:
    the first time constant control circuit includes a delay circuit; and
    the first time constant control signal is delayed by the delay circuit and is input to the switch circuit.

4. The electronic circuit according to claim 1, wherein: the input signal has a preamble period and a payload period following the preamble period; and
    the second time constant control circuit changes the time constant of the control circuit to the first time constant from the second time constant in a period after the payload period and a next preamble period.

5. The electronic circuit according to claim 4, wherein the first time constant control circuit changes the time constant of the control circuit to the second time constant from the first time constant in the preamble period.

6. The electronic circuit according to claim 1, wherein the first time constant control circuit changes the time constant of the control circuit to the second time constant from the first time constant after the bypass circuit starts bypassing.

7. The electronic circuit according to claim 1, wherein the bypass circuit starts bypassing in a case where the control signal becomes equal to or smaller than a reference value.

8. The electronic circuit according to claim 2, wherein the second time constant control circuit changes to the third time constant from the fourth time constant before the time constant of the control circuit is changed to the second time constant from the first time constant.

9. The electronic circuit according to claim 1, wherein:
    the first time constant control circuit generates the first time constant control signal on the basis of a result of comparison between the control signal and a threshold value; and
    the second time constant control circuit generates the second time constant control signal on the basis of a signal generated based on the third time constant and the threshold value.

10. The electronic circuit according to claim 1, wherein:
    the control circuit includes a first hold circuit having a resistor and a capacitor; and
    the time constant of the control circuit is changed in response to a change of a resistance of the resistor of the first hold circuit.

11. The electronic circuit according to claim 2, wherein:
    the second time constant control circuit includes a second hold circuit having a resistor and a capacitor; and
    the second time constant control circuit selects one of the third and fourth time constants in response to a change of a resistance of the resistor of the second hold circuit.

12. The electronic circuit according to claim 1, wherein: the input signal generated form a light receiving element.

13. The electronic circuit according to claim 1, wherein: the amplifier is a transimpedance amplifier.

* * * * *